US007381578B2

(12) United States Patent
Azuma

(10) Patent No.: US 7,381,578 B2
(45) Date of Patent: Jun. 3, 2008

(54) ELECTRIFYING METHOD AND MANUFACTURING METHOD OF ELECTRON-SOURCE SUBSTRATE

(75) Inventor: Hisanobu Azuma, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1 day.

(21) Appl. No.: 11/536,447

(22) Filed: Sep. 28, 2006

(65) Prior Publication Data

US 2007/0020787 A1 Jan. 25, 2007

Related U.S. Application Data

(62) Division of application No. 11/195,671, filed on Aug. 3, 2005, now Pat. No. 7,151,005, which is a division of application No. 10/760,284, filed on Jan. 21, 2004, now Pat. No. 6,972,203.

(30) Foreign Application Priority Data

Jan. 21, 2003 (JP) ............................ 2003-011733

(51) Int. Cl.
*H01L 21/00* (2006.01)
*H01J 1/52* (2006.01)

(52) U.S. Cl. ........................................ 438/20; 313/249

(58) Field of Classification Search .................. 438/20
See application file for complete search history.

(56) References Cited

U.S. PATENT DOCUMENTS 5,622,634 A 4/1997 Noma et al. .................. 216/40
6,169,356 B1 1/2001 Ohnishi et al. ............. 313/495
6,726,520 B2 4/2004 Takeda et al. ................ 445/62
6,848,961 B2 2/2005 Nomura et al. ............... 445/24
6,972,203 B2 * 12/2005 Azuma ........................ 438/20
7,151,005 B2 * 12/2006 Azuma ........................ 438/20
2001/0036682 A1 11/2001 Takeda et al. ................ 438/34
2002/0063535 A1 5/2002 Azuma .................... 315/169.3

FOREIGN PATENT DOCUMENTS

JP 7-235255 9/1995
JP 8-171849 7/1996
JP 2003-311594 11/2000

* cited by examiner

*Primary Examiner*—W. David Coleman
(74) *Attorney, Agent, or Firm*—Fitzpatrick, Cella, Harper & Scinto

(57) ABSTRACT

A method according to the present invention is for electrifying a plurality of electric conductors arranged on a substrate including the step of setting an average temperature difference during electrifying processing between a region $S_0$ in that the plurality of electric conductors on the substrate are arranged and a circumferential region $S_1$ of the region $S_0$ at 15° C. or more, and the substrate satisfies the relational expression:

$$L_1/L_0 > E\alpha\Delta T/\sigma th - 1.$$

where $L_0$[m]: the width of the region $S_0$
$L_1$[m]: the width of the region $S_1$
$\Delta T$[K]: the average temperature difference
E[Pa]: the Young's modulus of the substrate
$\alpha$[/K]: the coefficient of linear thermal expansion of the substrate
$\sigma th$[Pa]: the material constant of the substrate.

3 Claims, 7 Drawing Sheets

ELECTRIFYING METHOD AND MANUFACTURING METHOD OF ELECTRON-SOURCE SUBSTRATE

This application is a division of application Ser. No. 11/195,671, filed Aug. 3, 2005, which is a division of application Ser. No. 10/760,284, filed Jan. 21, 2004, which is now U.S. Pat. No. 6,972,203.

BACKGROUND OF THE INVENTION

1. Field of the Invention

The present invention relates to a method for electrifying a plurality of electric conductors arranged on a substrate, and in particular relates an electrifying method capable of preventing cracks of the substrate produced by a temperature difference of the substrate during the electrifying. Furthermore, it relates to a manufacturing method and a manufacturing device of an electron-source substrate having a plurality of electron-emission elements as well as a manufacturing method of an image-forming apparatus on the basis of the electrifying method.

2. Description of the Related Art

Hitherto, as the electron-emission element, two kinds of elements using a thermal electron-emission element and a cold cathode electron-emission element are known as a general classification. The cold cathode electron-emission element generally includes a field emission type, a metal/insulting layer/metal type, and a surface-conduction electron-emission element.

The surface-conduction electron-emission element utilizes a phenomena that an electron is emitted by applying an electric current through a conductive film with a small area formed on a substrate in parallel with the film surface. The inventor has been made a number of proposals regarding to the surface-conduction electron-emission element and its application. For example, its basic structure and manufacturing method are disclosed in Japanese Patent Laid-Open No. 7-235255 and Japanese Patent Laid-Open No. 8-171849.

The surface-conduction electron-emission element disclosed in the above-mentioned Publications is characterized in that on a substrate, there are provided a pair of element electrodes opposing each other and a conductive film having an electron-emission portion disposed in part thereof and connected to the element electrodes. The conductive film is provided with a crack formed in part thereof. Also, at the end of the crack formed is a deposited film having at least one of carbon and a carbon compound as a principal ingredient.

By arranging a plurality of such electron-emission elements on the substrate and electrically connecting these electron-emission elements together with wiring, an electron-source substrate having a plurality of surface-conduction electron-emission elements can be structured.

By combining the above-mentioned electron-source substrate with a fluorescent substance, a display panel of an image-forming apparatus can be structured.

Up to know, such an electron-source substrate has been manufactured as follows:

A first is to form a plurality of elements each including the conductive film and a pair of the element electrodes connected to the conductive film and wiring for connecting a plurality of the elements on the substrate. Next, part of the structured electron-source substrate (at least including a forming region of the conductive film) is placed into a vacuum chamber. Then, after the vacuum chamber is evacuated, a voltage is applied across the elements via a probe and the wiring so as to form a crack on the conductive film of each element (referred to as forming below). Thereafter, gas containing an organic material is introduced into the vacuum chamber, and a voltage is again applied across each element under a desired gas partial pressure of the organic material so as to deposit carbon or a carbon compound at the end of the crack (referred to as activation below).

Japanese Patent Laid-Open No. 2000-311594, as shown in FIG. 10, discloses that a sealed atmosphere is formed with a substrate and a container covering the substrate, and a conductive film arranged on the substrate is electrified (forming and activation processing).

Referring to FIG. 10, numeral 1010 denotes a substrate; numeral 1011: a support unit; numeral 1012: a vacuum container; numeral 1015: a gas inlet; numeral 1016: an outlet; numeral 1018: a sealing member; numeral 1019: a diffusion plate; numeral 1020: a heater; numeral 1021: hydrogen or organic material gas; numeral 1022: carrier gas; numeral 1023: a water-removal filter; numeral 1024: a gas-flow control unit; numerals 1025*a* to 1025*f*: valves; numeral 1026: a vacuum pump; numeral 1027: a vacuum meter; numeral 1028: piping; numeral 1032: a driver composed of a power supply and a current control system; numeral 1031: wiring for connecting taking out wiring of the substrate to the driver; numeral 1033: an opening of the diffusion plate 1019; and numeral 1041: a thermal conduction member.

The support unit 1011 is for fixing the substrate 1010 with a mechanism such as a vacuum chucking mechanism, an electrostatic chucking mechanism, or a mechanical fixing jig.

To the vacuum container 1012, a vacuum pump 1026 for evacuating the container inside and a gas introducing device for introducing an organic material as gas are connected.

The substrate 1010 is arranged on the support unit 1011, and the surface of the substrate 1010 is covered with the vacuum container 1012 for evacuating part of a region including a plurality of elements formed on the substrate 1010. Thereby, a region surface having a plurality of elements formed on the substrate can be drawn a vacuum or exposed to an atmosphere under a desired pressure or partial pressure of an organic material. Furthermore, since part of each piece of wiring formed so as to connect to a plurality of the elements formed on the substrate is exposed, a desired electrical signal (potential) can be supplied to a pair of the electrodes constituting each element via a probe unit (not shown).

After completion of the activation processing, the container 1012 is removed from the substrate surface, and the substrate 1010 is further peeled off the support unit 1011 so as to have the electron-source substrate.

The manufacturing method described above has been adopted; however, in order to reduce a tact time in manufacturing the electron-source substrate and to improve electron-source characteristics, in the activation processing, it is indispensable to provide a high duty to a waveform of a voltage for being applied to each element within the gas containing an organic material.

On the other hand, from users of a recent liquid crystal display and a plasma display, a small-width frame structure is required.

Upon electrifying the electron-source substrate with a small-width frame by the electrifying method with high duty in a conventional processing within organic gas, an electron-emission element forming region (the center of the substrate) on the electron-source substrate is mainly heated so as to rise in temperature, so that cracks may be produced at an end of the electron-source substrate by a thermal stress due to a temperature difference to the periphery of the substrate.

There may be a technique for relaxing the stress by cooling the bottom surface of the electron-emission element forming region on the electron-source substrate while heating the periphery; however, since the heat is recovered in the thickness direction of the substrate, with increasing duty, the temperature difference between top and bottom surfaces of the substrate increases, so that there is a limit to the effect of stress relaxation.

SUMMARY OF THE INVENTION

It is an object of the present invention to provide an electrifying method capable of preventing a substrate from cracking due to a temperature difference between an electrifying region (heating region) of the substrate and the circumferential region thereof.

It is another object of the present invention to provide a manufacturing method and a manufacturing device of an electron-source substrate that achieve improvements in characteristics and in yield of an electron-emission element.

It is still another object of the present invention to provide a manufacturing method of a planar shape image-forming apparatus excellent in image quality.

A method for electrifying a plurality of electric conductors arranged on a substrate comprises the step of setting an average temperature difference during electrifying processing between a region $S_0$ in that the plurality of electric conductors on the substrate are arranged and a region $S_1$ located on the periphery of the region $S_0$ at 15° C. or more, wherein the substrate satisfies the relational expression:

$$L_1/L_0>E\alpha\Delta T/\sigma th-1.$$

where $L_0$[m]: the width of the region $S_0$ $L_1$[m]: the width of the region $S_1$ $\Delta T$[K]: the average temperature difference E[Pa]: the Young's modulus of the substrate $\alpha$[/K]: the coefficient of linear thermal expansion of the substrate $\sigma$th[Pa]: the material constant of the substrate A method for manufacturing an electron-source substrate comprises the steps of electrifying a plurality of electric conductors arranged on a substrate in a hermetic atmosphere so as to impart an electron-emission function to part of the electric conductors; and setting an average temperature difference during the electrifying processing between a region $S_0$ in that the plurality of electric conductors on the substrate are arranged and a region $S_1$ located on the periphery of the region $S_0$ at 15° C. or more, wherein the substrate satisfies the relational expression:

$$L_1/L_0>E\alpha\Delta T/\sigma th-1.$$

where $L_0$[m]: the width of the region $S_0$ $L_1$[m]: the width of the region $S_1$ $\Delta T$[K]: the average temperature difference E[Pa]: the Young's modulus of the substrate $\alpha$[/K]: the coefficient of linear thermal expansion of the substrate $\sigma$th[Pa]: the material constant of the substrate According to an electrifying method of the present invention, the substrate can be effectively prevented from cracking due to the temperature difference of the substrate between an electrifying region (heating region) and a circumferential region. For example, by applying it to a manufacturing process of an electron-source substrate and an image-forming apparatus, improvement in image quality (activation with high duty), improvement in a value added to a product (small-width frame structure), and cost down (yield and productivity) are achieved.

Further objects, features and advantages of the present invention will become apparent from the following description of the preferred embodiments with reference to the attached drawings.

DESCRIPTION OF THE PREFERRED EMBODIMENTS

Figure 1:
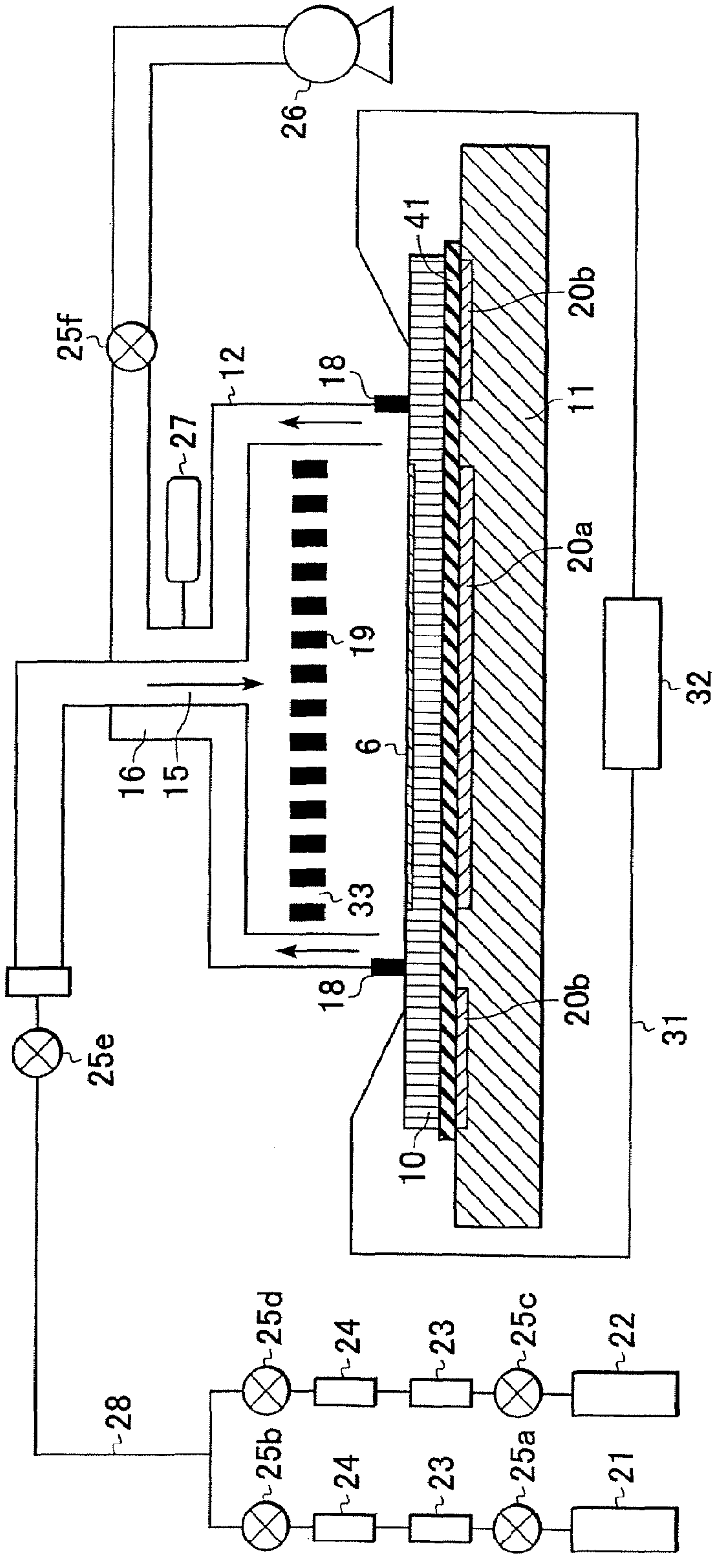
FIG. 1 is a sectional view schematically showing a portion for electrifying processing in a sealed atmosphere in a manufacturing device of an electron-source substrate according to the present invention.

A method according to the present invention is for electrifying a plurality of electric conductors arranged on a substrate including the step of setting an average temperature difference during electrifying processing between a region $S_0$ in that the plurality of electric conductors on the substrate are arranged and a region $S_1$ located on the periphery of the region $S_0$ at 15° C. or more, wherein the substrate satisfies the relational expression:

$$L_1/L_0>E\alpha\Delta T/\sigma th-1.$$

where $L_0$[m]: the width of the region $S_0$ $L_1$[m]: the width of the region $S_1$ $\Delta T$[K]: the average temperature difference E[Pa]: the Young's modulus of the substrate $\alpha$[/K]: the coefficient of linear thermal expansion of the substrate $\sigma$th[Pa]: the material constant of the substrate A method for manufacturing an electron-source substrate according to the present invention includes the steps of electrifying a plurality of electric conductors arranged on a substrate in a hermetic atmosphere so as to impart an electron-emission function to part of the electric conductors; and setting an average temperature difference during the electrifying processing between a region $S_0$ in that the plurality of electric conductors on the substrate are arranged and a region $S_1$ located on the periphery of the region $S_0$ at 15° C. or more, wherein the substrate satisfies the relational expression:

$$L_1/L_0 > E\alpha\Delta T/\sigma th - 1.$$

where $L_0$[m]: the width of the region $S_0$ $L_1$[m]: the width of the region $S_1$ ΔT[K]: the average temperature difference E[Pa]: the Young's modulus of the substrate α[/K]: the coefficient of linear thermal expansion of the substrate σth[Pa]: the material constant of the substrate Preferably, a manufacturing method of an electron-source substrate according to the preferred embodiment of the present invention further includes the step of cutting the substrate into desired sizes after the electrifying processing; the cutting step includes making dust-proof for covering the region of the electric conductors and at least one of the steps of wheel-cutter cutting, dicing, and sandblast cutting; the manufacturing method further includes the steps of chamfering, polishing, and cleaning the periphery of the substrate after the cutting; the electrifying step in the hermetic atmosphere includes the steps of covering the region of the electric conductors on the substrate with a container, and exhausting and introducing gas after the covering step; and the electric conductors each include a pair of electrodes and a conductive film formed between the electrodes and the electrodes are electrically connected to wiring, and after the electrifying processing, this conductive film becomes the surface-conduction electron-emission element.

In a device for manufacturing an electron-source substrate for electrifying a plurality of electric conductors arranged on a substrate in a hermetic atmosphere so as to impart an electron-emission function to part of the electric conductors, the device includes a fixing unit for holding the substrate, an atmosphere control unit for controlling the atmosphere of the substrate, and a cutting unit for cutting the substrate into desired sizes after the electrifying processing.

Preferably, in a device for manufacturing an electron-source substrate according to the preferred embodiment of the present invention, an average temperature difference during electrifying processing between a region $S_0$ in that the plurality of electric conductors on the substrate are arranged and a region $S_1$ located on the periphery of the region $S_0$ is set at 15° C. or more, wherein the substrate satisfies the relational expression:

$$L_1/L_0 > E\alpha\Delta T/\sigma th - 1.$$

where $L_0$[m]: the width of the region $S_0$ $L_1$[m]: the width of the region $S_1$ ΔT[K]: the average temperature difference E[Pa]: the Young's modulus of the substrate α[/K]: the coefficient of linear thermal expansion of the substrate σth[Pa]: the material constant of the substrate; an electron-source substrate with a material constant σth of $20\times10^6$[Pa] can be processed; the cutting unit includes a cutting unit such as a wheel-cutter, a dicing cutter, or a sandblast cutter and a dust-proof unit for covering the region of the electric conductors; the device further includes a chamfering unit, a polishing unit, and a cleaning unit for processing the periphery of the substrate after the cutting; the atmosphere control unit includes a container for covering the region of the electric conductors on the substrate, and the container includes an exhausting unit and an introducing unit for gas; the fixing unit includes a unit formed thereon for vacuum attracting the substrate; the fixing unit includes a unit formed thereon for electrostaticaly attracting the substrate; and the fixing unit includes a control unit formed thereon for controlling the temperature of the substrate, which includes a heating unit and a cooling unit.

An electrifying method according to the present invention is associated with electrifying a plurality of electric conductors arranged on a substrate, and is for preventing the substrate from cracking due to the temperature difference between that of the electrifying region (i.e., the region where the conductors are arranged) and that of the circumferential region thereof. Specifically, the electrifying method according to the present invention is suitably used for the electrifying process such as the activation in a manufacturing process of surface-conduction electron-emission elements, for example. An embodiment of the present invention will be specifically described by exemplifying the manufacturing of an electron-source substrate having the surface-conduction electron-emission elements.

Figure 2:
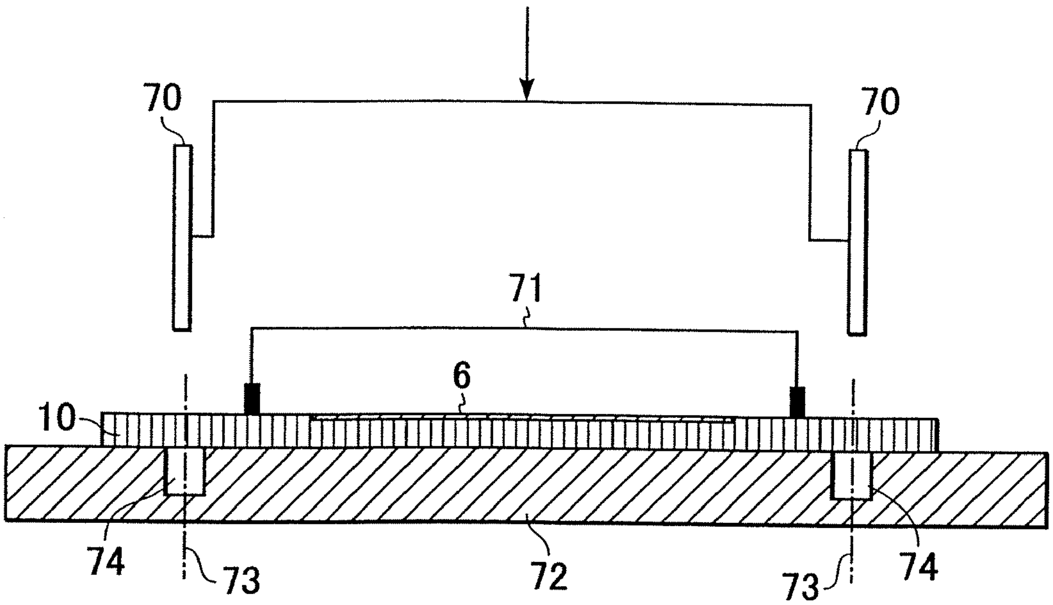
FIG. 2 is a sectional view schematically showing a portion for cutting the substrate into desired sizes after the electrifying processing in the manufacturing device of the electron-source substrate according to the present invention.

FIGS. 1 and 2 are sectional views of a manufacturing device of an electron-source substrate according to a first embodiment of the present invention: FIG. 1 shows part of the device for electrifying a plurality of conductors arranged on a substrate in a hermetic atmosphere, and FIG. 2 shows part of the device for cutting the substrate after the electrifying processing into desired sizes.

Referring to FIGS. 1 and 2, numeral 10 denotes a substrate; numeral 11: a support unit, numeral 12: a vacuum container, numeral 15: a gas inlet, numeral 16: an outlet, numeral 18: a sealing member, numeral 19: a diffusion plate, numerals 20*a* and 20*b*: heaters, numeral 21: hydrogen or organic gas, numeral 22: carrier gas, numeral 23: a water-removal filter, numeral 24: a gas-flow control unit, numerals 25*a* to 25*f*: valves, numeral 26: a vacuum pump, numeral 27: a vacuum meter, numeral 28: piping, numeral 31: wiring for connecting between a driver and taking-out wiring (not shown) formed on the substrate 10, numeral 32: the driver composed of a power supply and a current control system, numeral 33: an opening of the diffusion plate 19, and numeral 41: a thermal conduction member. Furthermore, numeral 6 denotes a region where conductors formed on the substrate 10 are arranged (referred to as a conductor-forming region below), numeral 70: a cutting unit, 71: a dust-proof unit, numeral 72: a fixed stand for cutting, numeral 73: a cutting center line of the substrate, and numeral 74: a flank of the fixed stand for cutting.

The support unit 11 is for fixing the substrate 10 with a mechanism such as a vacuum chucking mechanism, an electrostatic chucking mechanism, or a mechanical fixing jig, and is provided with the heaters 20*a* and 20*b* arranged therein, thereby heating the substrate 10 via the thermal conduction member 41 if required.

The thermal conduction member 41 is arranged on the support unit 11; alternatively, it may be clamped between the support unit 11 and the substrate 10, or embedded within the support unit 11 so as not to be an obstacle to the mechanism for fixing the substrate 10.

The thermal conduction member 41 can absorb the warp or the swell of the substrate 10, and can reliably transmit the heat produced in electrical processing to the support unit 11 and radiate the heat.

The thermal conduction member 41 may be a viscous liquid material such as silicone grease, oil silicone, and a gel material. If the viscous-liquid support unit 11 has harmful effects when the viscous-liquid thermal conduction member

41 is moving on the support unit 11, the support unit 11 may be provided with a retention mechanism such that the viscous liquid material retains at a predetermined position and region on the support unit 11, i.e., at least underneath the conductor-forming region of the substrate 10. This may be a thermal conduction member in that the viscous liquid material is hermetically sealed in an O-ring or a heat-resistant bag, for example.

On the other hand, the thermal conduction member 41 may be an elastic member. The elastic member may use a synthetic resin such as Teflon™, a rubber material such as silicone rubber, a ceramic material such as alumina, and a metallic material such as cupper and aluminum.

The heater 20*a* and 20*b* are a heater and a cooler combined with a temperature control thermocouple. Both are hermetically sealed tubes each having a temperature control medium included therein.

The vacuum container 12 is made of glass or stainless steel, and preferably made of a material having a small amount of gas emitted from the internal wall of the container. The vacuum container 12 covers the conductor-forming region 6 except the taking-out wiring, and withstands at least a pressure from $1.33\times10^{-1}$ Pa to the atmospheric pressure.

The sealing member 18 is for securing the air tightness between the substrate 10 and the vacuum container 12, and an O-ring or a rubber sheet is used.

The organic material gas 21 uses an organic material for activating an electron-emission element, which will be described later, or a gaseous mixture of an organic material diluted by nitrogen, helium, and argon. During the electrifying processing of forming, which will be described later, reductive gas such as hydrogen gas for accelerating crack-forming on a conductive film may also be introduced into the vacuum container 12. When gas is introduced in another process in such a manner, a desired system may be connected to the introducing piping 28 for the vacuum container 12 with introducing piping and the valve 25*e*.

As the organic materials for activating the electron-emission element, there may be alkane, alkene, and alkyne aliphatic hydrocarbons, aromatic hydrocarbons, alcohol, aldehyde, ketone, amine, nitrile, organic acids such as phenol, carbon, and sulfonic acid. More specifically, used are saturated hydrocarbons represented by the composition formula $C_nH_{2n+2}$, such as methane, ethane, and propane, unsaturated hydrocarbons represented by the composition formula $C_nH_{2n}$, such as ethylene and propylene, benzene, toluene, methanol, ethanol, acetaldehyde, acetone, methyl ethyl ketone, methyl amine, phenol, benzonitrile, tolunitrle, and acetonitrile.

Although depending on the kind of the organic material used for the activation, according to the embodiment, it is preferable that the partial pressure of the organic gas be about from $10^{-4}$ to $10^{-1}$ Pa.

In the case that the organic material is gas at the normal temperature, the organic gas 21 can be used as it is while if it is liquid or solid at the normal temperature, it is used by evaporating the liquid or sublimating the solid within the container. Also, it can be used by mixing with dilution gas. The carrier gas 22 uses inactive gas such as argon and helium.

The organic gas 21 and the carrier gas 22 are introduced into the vacuum container 12 by being mixed at a predetermined rate. The flow rates of both gases and the mixture rate are controlled by the gas-flow control unit 24. The gas-flow control unit 24 is composed of a mass flow controller and magnetic valves. The mixed gas is introduced into the vacuum container 12 from the gas inlet 15 after being heated at a desired temperature by a heater (not shown) disposed in the vicinity of the piping 28 if required. It is preferable that the heating temperature of the mixed gas be similar to that of the substrate 10.

The water in the introduced gas may be preferably removed by providing the water-removal filter 23 in the midstream of the piping 28. The water-removal filter 23 may use an absorbent such as silica gel, a molecular sieve, and magnesium hydroxide.

The mixed gas introduced into the vacuum container 12 is exhausted by the vacuum pump 26 via the outlet 16 at a constant speed so as to maintain the pressure of the mixed gas in the vacuum container 12 at a constant pressure. The vacuum pump 26 may use a low-vacuum pump such as a dry pump, a diaphragm pump, and a scroll pump, and it may be preferably an oil-free pump.

Providing the diffusion plate 19 between the gas inlet 15 of the vacuum container 12 and the substrate 10 controls the flow of the mixed gas so as to uniformly supply the organic material on the entire substrate 10, preferably improving the uniformity of the electron-emission element. The diffusion plate 19, as shown in FIG. 1, uses a metallic plate having the opening 33 formed thereon.

A taking-out electrode (not shown) of the substrate 10 is provided outside the vacuum container 12, and is connected to the driver 32 from the wiring 31 using TAB wiring and a probe.

According to the embodiment, since the vacuum container 12 may cover only the conductor-forming region 6, the device can be miniaturized. Also, since the taking-out electrode is located outside the vacuum container 12, the electrical connection to the driver 32 for electrifying the substrate 10 can be readily performed.

In such a manner, in the state that the mixed gas containing the organic material is poured into the vacuum container 12, by applying a pulse voltage to each element formed on the substrate 10 using the driver 32, the element can be activated.

In order to manufacture an electron-source substrate having a surface-conduction electron-emission element, in terms of the improvement of element characteristics and the demand for reducing the process period, it is indispensable to provide a high duty to the voltage pulse applied during the activation.

Figure 3:
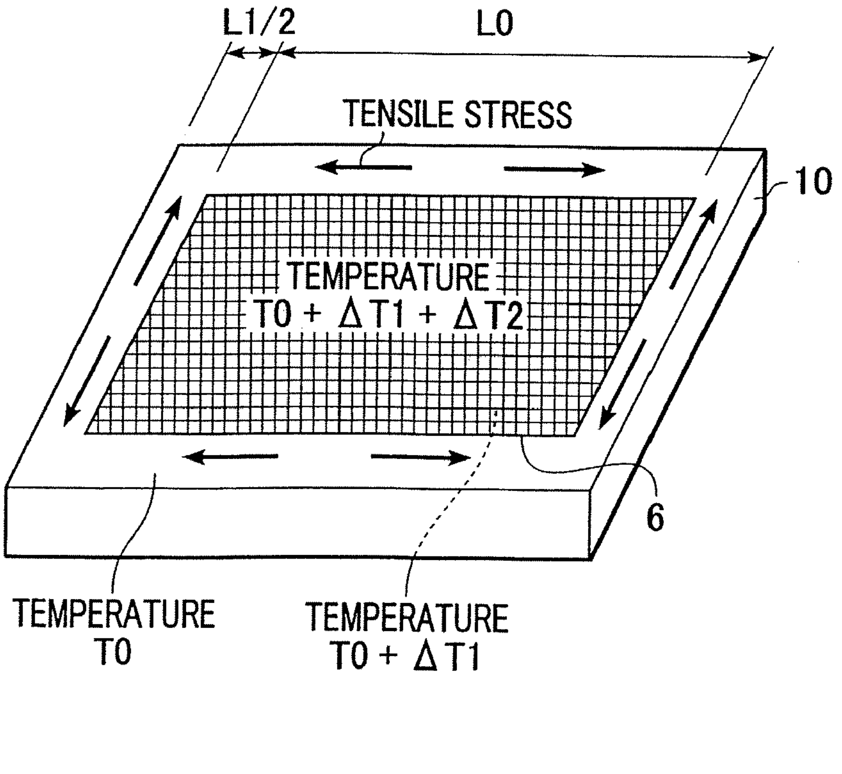
FIG. 3 is a drawing for illustrating a force applied to the substrate due to the temperature difference between an electrifying region and a circumferential region thereof.

However, with increasing duty in the voltage pulse, the temperature difference $\Delta T_1$ between a heating region (corresponding to the conductor-forming region 6) on the substrate 10 and the bottom surface and the temperature difference $\Delta T_2$ between the heating region and the vicinity thereof are increased. The situations are shown in FIG. 3. As a result, a large tensile stress is applied to the peripheral end of the substrate 10, sharply increasing the break-down probability of the substrate 10.

In order to prevent such a break-down of the substrate 10, a structure for efficiently relieving the heat from the heating region (the conductor-forming region 6) is known; however, increase in the temperature difference $\Delta T_2$ with increasing the heating value cannot be avoided. Furthermore, recently, a small-width frame structure has been supported by users as a trend of a liquid crystal display and a plasma display, so that it is desired that the size of an image-forming region (conductor-forming region 6) is approximated to that of the electron-source substrate so as to reduce a peripheral portion to the utmost.

The stress a applied to the periphery of the substrate 10 due to heating the conductor-forming region 6 is approximately represented by the equation (1):

$$\sigma=E\alpha\Delta T/(L_1/L_0+1) \quad (1)$$

where $\Delta T$ ($\Delta T_1+\Delta T_2/2$): the average difference between the temperature of the conductor-forming region 6 and that of the periphery thereof $L_1/L_0$: the width ratio $\alpha$: the coefficient of linear thermal expansion of the substrate 10

E: the elastic modulus (Young's modulus) of the substrate 10

The equation expresses the stress increases as a matter of course because of the increase in the temperature difference $\Delta T$ due to the increased duty and of the decrease in the width ratio $L_1/L_0$ due to the decreased-width frame structure.

The inventor has exerted great efforts and studies conquering various difficult problems, and consequently has made the present invention being compatible the increased duty with the decreased-width frame structure. Since the large temperature difference $\Delta T$ must be granted, the substrate with a large width ratio $L_1/L_0$ is used during the activation processing, and after the processing, the substrate is cut into sizes at an appropriate timing so as to have a desired small-width frame structure.

In general, in order to stably execute the processing using a glass substrate as the substrate 10 with a high yield, it is preferable that the material constant $\sigma th$ of the substrate be $\sigma th=20\times10^6$[Pa]. When the equation (1) is rearranged with regard to the width ratio $L_1/L_0$, the equation (2) is obtained:

$$L_1/L_0>E\alpha\Delta T/\sigma th-1 \quad (2).$$

That is, if the average temperature difference $\Delta T$, the elastic modulus E and the linear thermal expansion coefficient $\alpha$ of the substrate 10 are given, the minimum required width ratio $L_1/L_0$ is obtained. According to the studies by the inventor, while if the temperature difference $\Delta T$ is increased larger than 15° C., the break-down probability of the substrate is increased, it can be largely reduced by designing $L_1$ and $L_0$ so as to satisfy the equation (2), i.e., to increase the overlap width.

According to the embodiments of the manufacturing device and the manufacturing method, the substrate with high duty activation and with the decreased-width frame can be manufactured with a high yield, i.e., high productivity. On the other hand, by the improvement of electron-source characteristics, a bright display panel with the small-width frame and low electric power consumption can be obtained.

EXAMPLES

The present invention will be described below in detail by exemplifying specific examples; however, the present invention is not limited to the examples and various modifications in design and element exchanges can be made within the scope in that the object of the present invention can be achieved.

First Example

Figure 6:
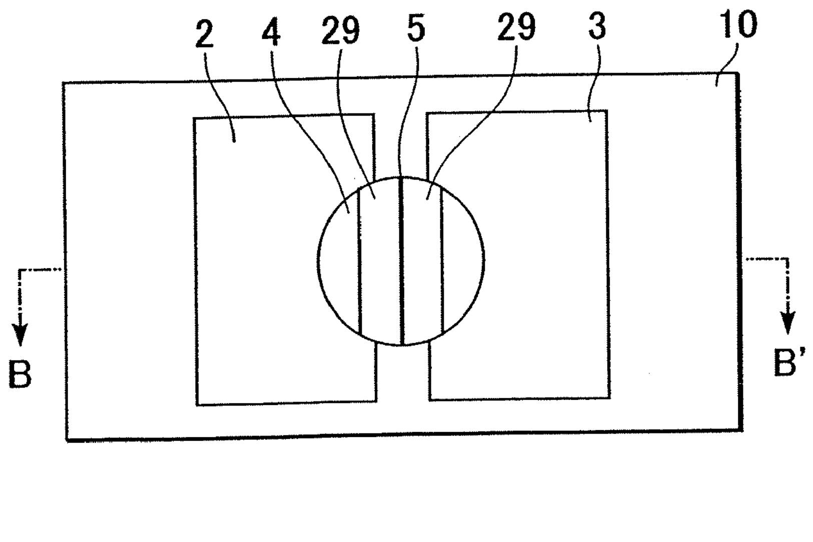
FIG. 6 is a plan view of a structure of an electron-emission element according to the present invention.
Figure 7:
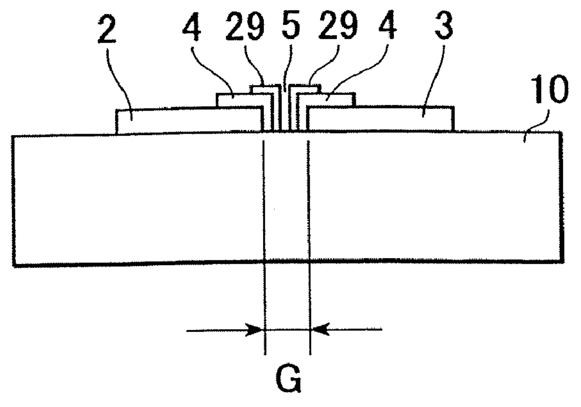
FIG. 7 is a sectional view of a structure of the electron-source substrate according to the present invention.
Figure 8:
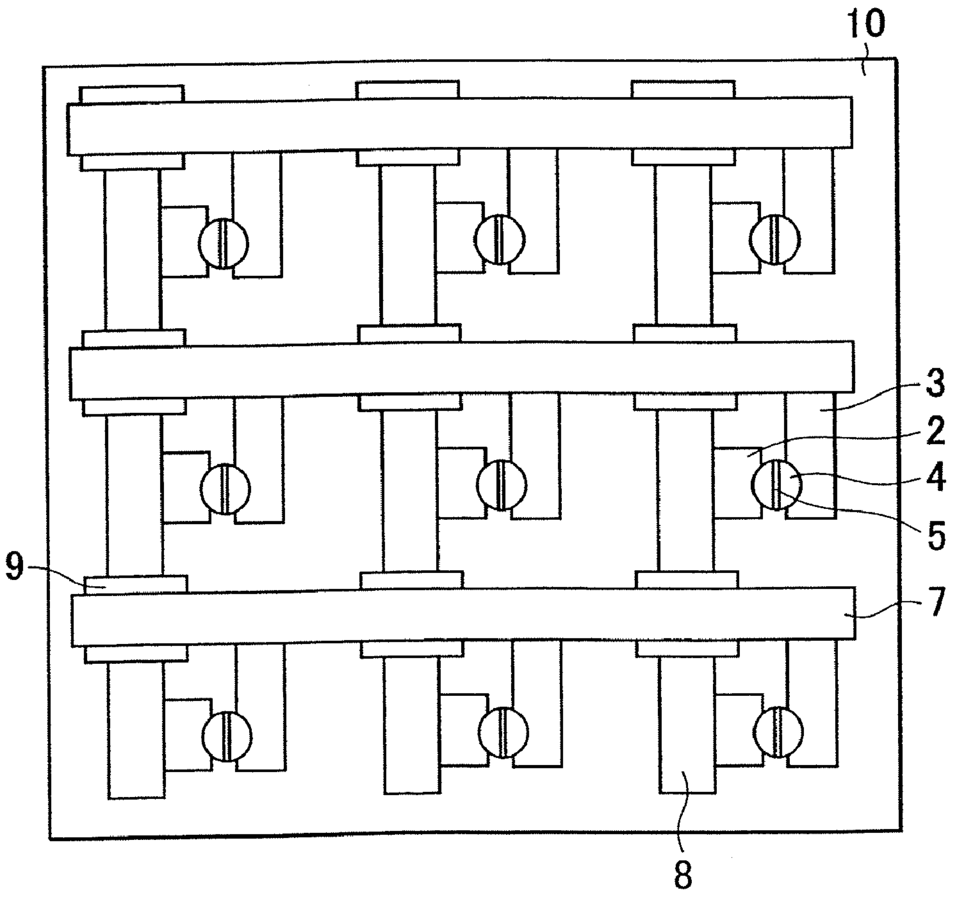
FIG. 8 is a plan view of the electron-source substrate according to the present invention.

A first example is a method for manufacturing an electron-source substrate, shown in FIG. 8, having a plurality of surface-conduction electron-emission elements shown in FIGS. 6 and 7 with a manufacturing device according to the present invention. Referring to FIGS. 6 to 8, numeral 10 denotes a substrate; numerals 2 and 3: element electrodes; numeral 4: a conductive film; numeral 29: a carbon film; numeral 5: a clearance between the carbon films 29; and symbol G denotes a gap between the conductive films 4.

Figure 9:
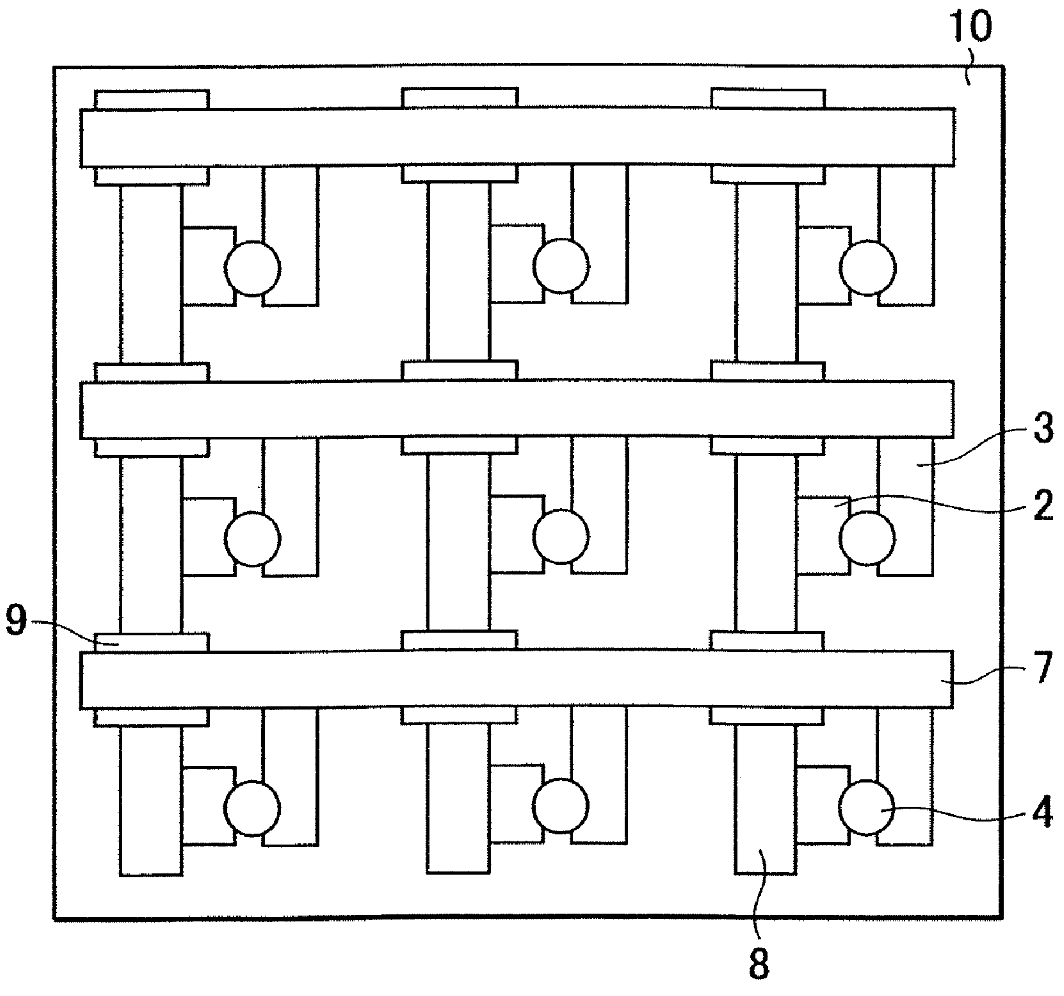
FIG. 9 is a plan view for illustrating a manufacturing method of the electron-source substrate according to the present invention.
Figure 10:
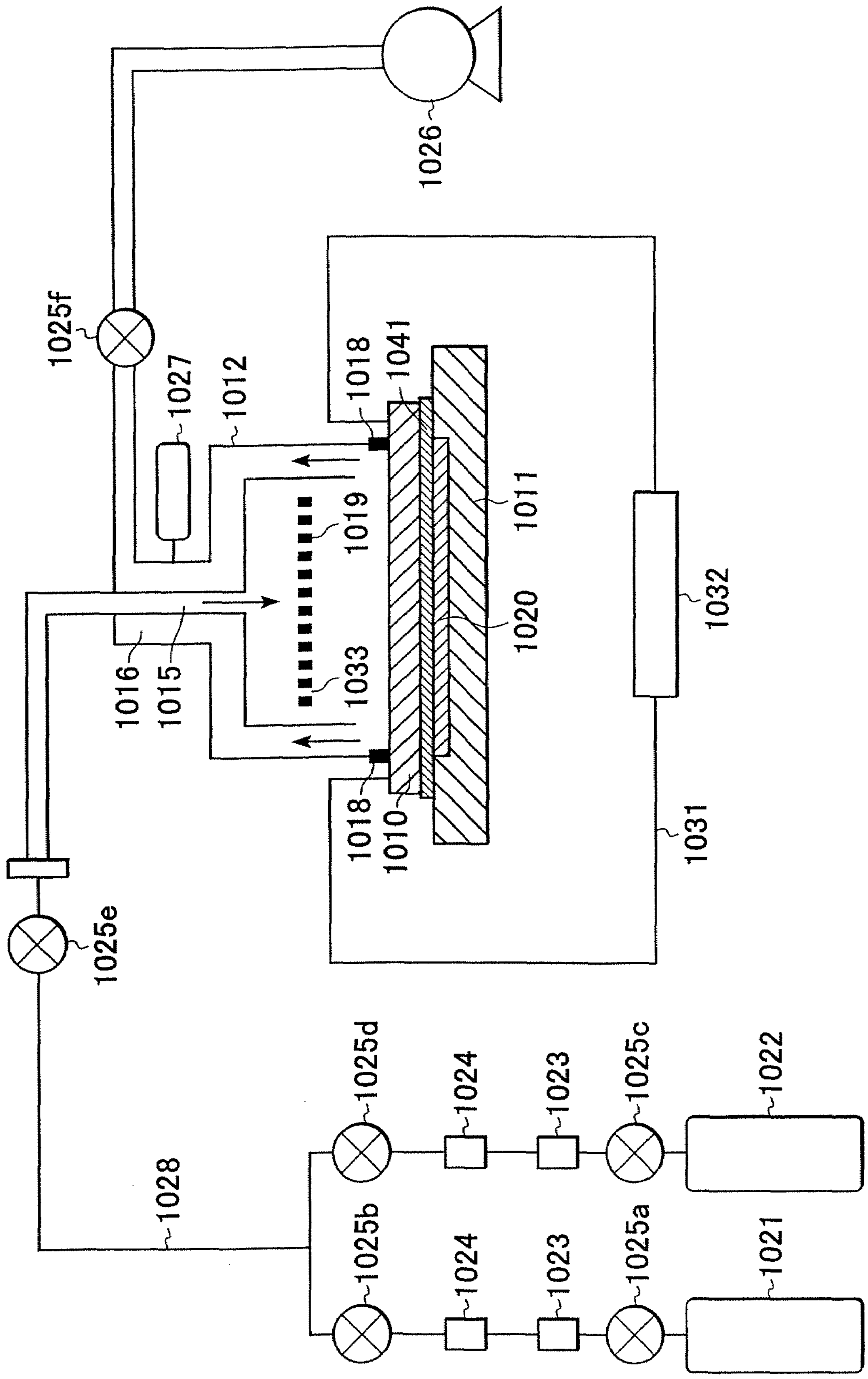
FIG. 10 is a sectional view for schematically showing a conventional manufacturing method of the electron-source substrate.

On the glass substrate 10 (350 mm×300 mm in size, 2.8 mm in thickness) made by depositing $SiO_2$ layers, Pt (platinum) paste was printed by offset printing so as to form element electrodes 2 and 3, shown in FIG. 9, with a thickness of 50 nm by baking it. Also, by screen printing, Ag (silver) paste was printed and baked so as to form X-direction wiring 7 (240 pieces) and Y-direction wiring 8 (720 pieces). On the crossing section of the X-direction wiring 7 with the Y-direction wiring 8, insulating paste was printed by screen printing so as to form an insulating layer 9 by baking it.

Next, between the element electrodes 2 and 3, palladium complex solution was dropped using a Bubble-Jet™ ejector and heated at 350° C. for 30 minutes so as to form the conductive film 4, shown in FIG. 9, made from fine particles of palladium oxide. The thickness of the conductive film 4 was 20 nm.

In such a manner, the substrate 10 was made in that a plurality of conductors composed of a pair of the element electrodes 2 and 3 and the conductive film 4 are laid out in a matrix arrangement in the X-direction wiring 7 and the Y-direction wiring 8. The size of the image-forming region (conductor-forming region 6) is 165.6 mm×165.6 mm.

When the warp or swell of the substrate were observed, the periphery was warped by about 0.5 mm relative to the center of the substrate including the warp or swell of the substrate itself and the warp or swell due to the heating processed thereafter.

The substrate 10 having the conductors formed thereon in such a manner was fixed on the support unit 11 of the manufacturing device shown in FIG. 1. Between the support unit 11 and the substrate 10, a thermal conductive rubber sheet 41 with a thickness of 1.5 mm was clamped.

Next, the stainless steel vacuum container 12 was arranged on the substrate 10 with the silicone rubber sealing member 18 therebetween so that the taking-out wiring on the substrate 10 is located outside the vacuum region. Above the substrate 10, as shown in FIG. 1, a metallic plate having the openings 33 was arranged as the diffusion plate 19.

Next, the valve **25*f* arranged adjacent to the outlet 16 was opened so as to evacuate the inside of the vacuum container 12 to be about $1.33\times10^{-1}$ Pa by the vacuum pump 26 (scroll pump). Thereafter, in order to remove water adhering to piping of an exhauster and to the substrate 10, the piping and the substrate 10 were heated up to 120° C. using a heater (not shown) for the piping and the heaters 20*a* and 20*b* for the substrate 10**, and gradually cooled to the room temperature after being held for 2 hours.

After the substrate 10 was returned to the room temperature, using the driver 32 connected to the taking-out wiring (not shown) via the wiring 31 shown in FIG. 1, a voltage was applied between the element electrodes 2 and 3 of each element via the X-direction wiring 7 and the Y-direction wiring 8 so as to form the gap G shown in FIG. 7 on each conductive film 4 by the forming processing of the conductive film 4.

Continuously, the activation processing was performed using the device. The valves **25*a* to 25*d* for supplying gas and the valve 25*e* disposed adjacent to the gas inlet 15 were opened so as to introduce the mixed gas of the organic gas 21 with the carrier gas 22 into the vacuum container 12. The organic gas 21 used nitrogen gas having 1% ethylene mixed therewith while the carrier gas 22 used nitrogen gas. The flows of the organic gas 21 and the carrier gas 22** were 40 sccm (standard cubic centimeters) and 400 sccm, respectively. The pressure inside the vacuum container 12 was controlled to be $133\times10^2$ Pa by adjusting the opening of the valve **25*f* checking the pressure indicated in the vacuum meter 27 disposed adjacent to the outlet 16**.

After about 30 minutes since the starting introduction of the organic gas 21, a voltage was applied between the element electrodes 2 and 3 of each element using the driver 32 via the X-direction wiring 7 and the Y-direction wiring 8 so as to perform the activation processing. The voltage was controlled to increase from 10 V to 17 V in 25 minutes, and the pulse width was set at 1 ms; the frequency: 100 Hz; and the activation period: 30 minutes. In the activation, the entire Y-direction wiring 8 and the non-selected lines of the X-direction wiring 7 were grounded (connected to the earth potential) in common, and 24 lines of the X-direction wiring 7 were selected so as to be sequentially applied to a pulse voltage of 1 ms. By repeating this method ten times, the entire lines of the X-direction wiring 7 were activated so as to finish to activate the entire lines in 5 hours.

In the past, 10 lines were selected so as to repeat the activation 24 times, requiring 12 hours for completing the activation of the entire lines. Furthermore, by the activation with high duty, the improvement in element characteristics was also confirmed.

As in this example, when the activation with high duty is performed, in the conductor-forming region 6 of the electron-source substrate 10 shown in FIG. 3 and its vicinity, the average temperature difference ΔT becomes 53.5° C. If the width ratio $L_1/L_0$ is studied from the above-mentioned equation (2):

$$L_1/L_0>0.64$$

where $L_0$: the width of the conductor-forming region 6

$L_1$: the width of the vicinity

The substrate used in the example was PD 200 glass; the elastic modulus: $E=77.5\times10^9$[Pa]; the linear thermal expansion coefficient: $\alpha=79\times10^{-7}$[/° C.]; and $\sigma th=20\times10^6$[Pa].

Figure 4:
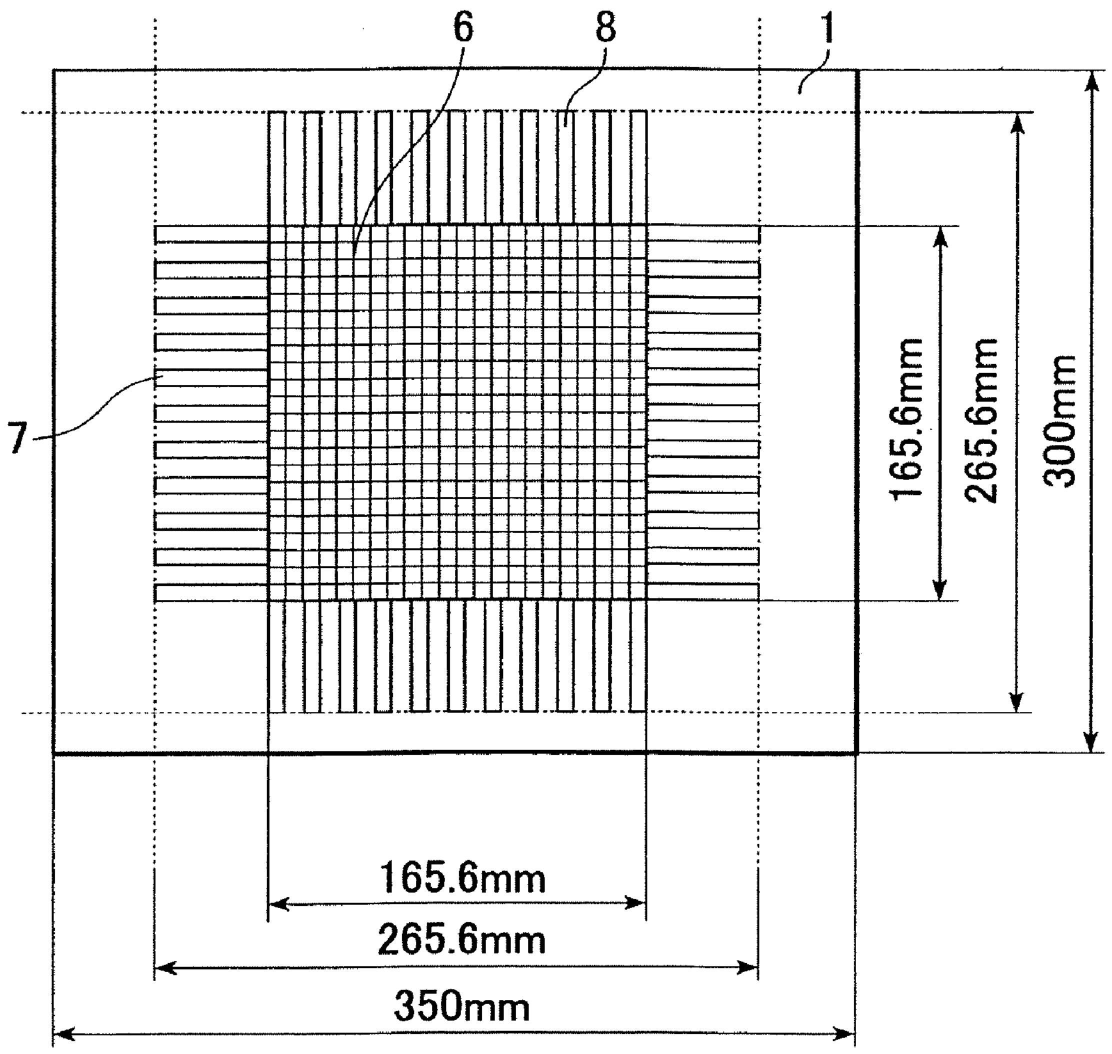
FIG. 4 is a plan view for schematically showing a structure of the electron-source substrate according to an embodiment of the present invention.

From the above condition, $L_0=165.6$ mm and $L_1>105$ mm are obtained so that the substrate is required 270.6 mm or more in size under the conditions of the example. Therefore, as shown in FIG. 4, 350 mm×300 mm (the size of the conductor-forming region is 165.6 mm×165.6 mm) is adopted. The size after the cutting is 265.6 mm×265.6 mm. By adopting the manufacturing device and the manufacturing method of this example, the stable activation can be performed without cracking of the substrate.

Upon completion of the activation, an element current If (current flowing between the element electrodes of the electron-emission element) was measured for each of X-direction wiring and compared. The resultant values are from about 1.35 A to 1.56 A in that the average is 1.45 A (corresponding to about 2 mA for each element); and dispersion for each wiring is about 8%, so that excellent activation could be performed.

On the electron-emission element finishing the activation, carbon films 29 are formed at an interval of the clearance 5 as shown in FIGS. 6 and 7.

During the activation, when the analysis of gas from the outlet 16 was performed using a mass spectrum measuring device with a differential exhauster, simultaneously with the introduction of the mixed gas, a mass number of 28 for nitrogen and ethylene and a mass number of 26 for the fragment of ethylene increased in a moment so as to be saturated, and both values were substantially constant during the processing.

Next, in order to make the electron-source substrate 10 structured as above the substrate with a small width frame structure, as shown in FIG. 2, the electron-source substrate 10 was shifted to and placed on the fixed stand 72 during cutting, and the conductor-forming region 6 was covered with the cover 71, which is a dust-proof unit. Continuously, ends of the substrate were cut off with the wheel cutter 70, which is a cutting unit. Thereafter, chamfering, polishing, and cleaning were performed with a chamfering unit, a polishing unit, and a cleaning unit, which are not shown.

The cutting was performed leaving the X-direction wiring 7 and the Y-direction wiring 8 intact. The cutting method is not limited to the wheel cutter method in the example, and general techniques may be adopted such as a dicing method and a sand blast method.

Figure 5:
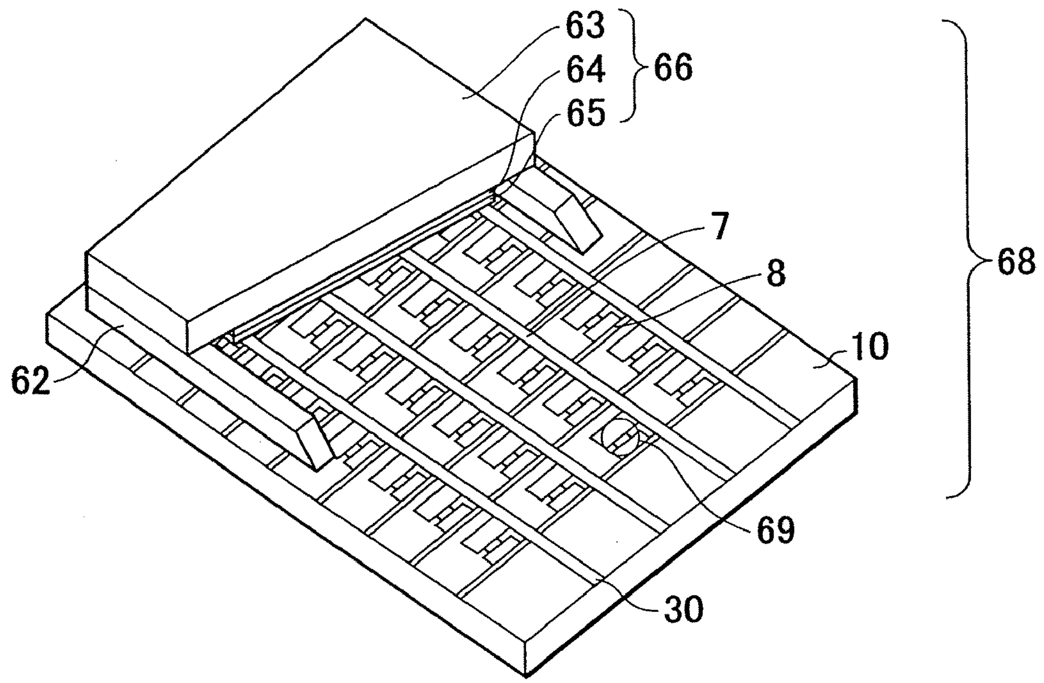
FIG. 5 is a perspective view showing a structure of an image-forming apparatus by cutting part thereof away.

Using the electron-source substrate 10 structured in such a manner, an image-forming apparatus (display panel) was manufactured as shown in FIG. 5. Referring to FIG. 5, numeral 69 denotes an electron-emission element; numeral 62: a support frame; numeral 66: a face plate composed of a glass substrate 63, a metal back 64, and a fluorescent substance 65; and numeral 68: a display panel.

First, the face plate 66 was placed at a position higher by 2 mm than the electron-source substrate 10 with the support frame 62 and a spacer (not shown) therebetween. In order to draw a vacuum from the inside of the panel, there are also provided an exhaust pipe (not shown) and a getter (not shown) in the panel. The panel was sealed at 420° C. in an argon atmosphere.

Then, on the panel shown in FIG. 5, images were displayed by connecting an X-direction wiring driver and a Y-direction wiring driver, which are not shown, and a high-voltage power supply to the panel so as to have a high voltage of 8 kV to the metal back 64 of the face plate 66. As a comparative example, a panel with low-duty activation by a conventional technique was made by the above-mentioned method. From the tested results, the panel according to the present invention was apparently better in terms of brightness and contrast. Also, since cracks of the substrate due to a thermal stress was suppressed according to the present invention, improvements in yield and commercial productivity were achieved.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for electrifying a plurality of electric conductors arranged on a substrate, comprising the steps of:

covering a substrate comprising a region $S_0$ in which the plurality of electric conductors are arranged and a region $S_1$ located on a periphery of the region $S_0$ with a container such that the region $S_0$ is positioned inside the container and the region $S_1$ is positioned outside the container;

exhausting gas such that a pressure in the container is lower than a pressure outside the container; and electrifying the plurality of electric conductors, wherein a width $L_0$[m] of the region $S_0$ and a width $L_1$ of the region $S_1$ on the substrate satisfies the relational expression:

$$L_1/L_0>E\alpha\Delta T/\sigma th-1$$

where

ΔT[K] represents an average temperature difference between the region $S_0$ and the region $S_1$ on the substrate in the electrifying step, the average temperature difference being 15° C. or more E[Pa] represents Young's modulus of the substrate α[/K] represents a coefficient of linear thermal expansion of the substrate, and σth[Pa] represents a material constant of the substrate.

2. A method for manufacturing an electron-source substrate, comprising the steps of:

covering a substrate comprising a region $S_0$ in which a plurality of electric conductors are arranged and a region $S_1$ located on a periphery of the region $S_0$ with a container such that the region $S_0$ is positioned inside the container and the region $S_1$ is positioned outside the container;

exhausting gas such that a pressure in the container is lower than a pressure outside the container; and electrifying the plurality of electric conductors, wherein a width $L_0$ [m] of the region $S_0$ and a width $L_1$ of the region $S_1$ on the substrate satisfies the relational expression:

$$L_1/L_0 > E\alpha\Delta T/\sigma th - 1.$$

where

ΔT[K] represents an average temperature difference between the region $S_0$ and the region $S_1$ on the substrate in the electrifying step, the average temperature difference being 15° C. or more E[Pa] represents Young's modulus of the substrate α[/K] represents a coefficient of linear thermal expansion of the substrate, and σth[Pa] represents a material constant of the substrate.

3. A manufacturing method according to claim 2, further comprising the step of cutting the substrate into desired sizes after the electrifying step.

* * * * *